(12) United States Patent
Kyogoku et al.

(10) Patent No.: US 10,381,441 B2
(45) Date of Patent: Aug. 13, 2019

(54) SEMICONDUCTOR DEVICE AND METHOD FOR MANUFACTURING THE SAME

(71) Applicant: Kabushiki Kaisha Toshiba, Minato-ku (JP)

(72) Inventors: Shinya Kyogoku, Tsukuba (JP); Ryosuke Iijima, Setagaya (JP)

(73) Assignee: Kabushiki Kaisha Toshiba, Minato-ku (JP)

( * ) Notice: Subject to any disclaimer, the term of this patent is extended or adjusted under 35 U.S.C. 154(b) by 0 days.

(21) Appl. No.: 15/902,360

(22) Filed: Feb. 22, 2018

(65) Prior Publication Data

US 2019/0131398 A1 May 2, 2019

(30) Foreign Application Priority Data

Oct. 30, 2017 (JP) .................................. 2017-209114

(51) Int. Cl.
*H01L 29/06* (2006.01)
*H01L 29/16* (2006.01)
*H01L 29/36* (2006.01)
*H01L 29/66* (2006.01)
*H01L 29/78* (2006.01)
(Continued)

(52) U.S. Cl.
CPC .... *H01L 29/0696* (2013.01); *H01L 21/26586* (2013.01); *H01L 21/308* (2013.01); *H01L 29/1608* (2013.01); *H01L 29/36* (2013.01); *H01L 29/66068* (2013.01); *H01L 29/7813* (2013.01)

(58) Field of Classification Search
CPC ........................ H01L 29/0696; H01L 21/3083
See application file for complete search history.

(56) References Cited

U.S. PATENT DOCUMENTS 6,541,818 B2  4/2003  Pfirsch et al.
9,653,599 B2  5/2017  Kobayashi et al.
(Continued)

FOREIGN PATENT DOCUMENTS

JP  4017826  12/2007
JP  2015-207588  11/2015
(Continued)

*Primary Examiner* — Farun Lu
(74) *Attorney, Agent, or Firm* — Oblon, McClelland, Maier & Neustadt, L.L.P.

(57) ABSTRACT

According to one embodiment, a semiconductor device includes first to third electrodes, first to fourth semiconductor regions, and a first insulating film. The first electrode includes a first conductive region. The second electrode includes a second conductive region. The first semiconductor region includes first to fourth partial regions. The second semiconductor region includes a fifth partial region. The third semiconductor region includes a sixth partial region provided between the fourth partial region and the fifth partial region. The fourth semiconductor region includes is electrically connected to the second conductive region, and includes first and second portions. The first insulating film includes first to third insulating regions. The first insulating region is positioned between the first portion and the first conductive region. The second insulating region contacts the fourth and sixth partial regions. The third insulating region is positioned between the second portion and the first conductive region.

18 Claims, 12 Drawing Sheets

(51) Int. Cl.
*H01L 21/265* (2006.01)
*H01L 21/308* (2006.01)

(56) References Cited

U.S. PATENT DOCUMENTS

| | | | |
|---|---|---|---|
| 2011/0291110 A1* | 12/2011 | Suzuki | H01L 29/0878 257/77 |
| 2013/0306983 A1 | 11/2013 | Nakano et al. | |
| 2017/0040420 A1 | 2/2017 | Mori et al. | |

FOREIGN PATENT DOCUMENTS

| | | |
|---|---|---|
| JP | 6090805 | 3/2017 |
| JP | 2017-79251 | 4/2017 |

\* cited by examiner

SEMICONDUCTOR DEVICE AND METHOD FOR MANUFACTURING THE SAME

CROSS-REFERENCE TO RELATED APPLICATIONS

This application is based upon and claims the benefit of priority from Japanese Patent Application No. 2017-209114, filed on Oct. 30, 2017; the entire contents of which are incorporated herein by reference.

FIELD

Embodiments described herein relate generally to a semiconductor device and a method for manufacturing the same.

BACKGROUND

It is desirable to reduce the switching loss of a semiconductor device.

DETAILED DESCRIPTION

Figure 1:
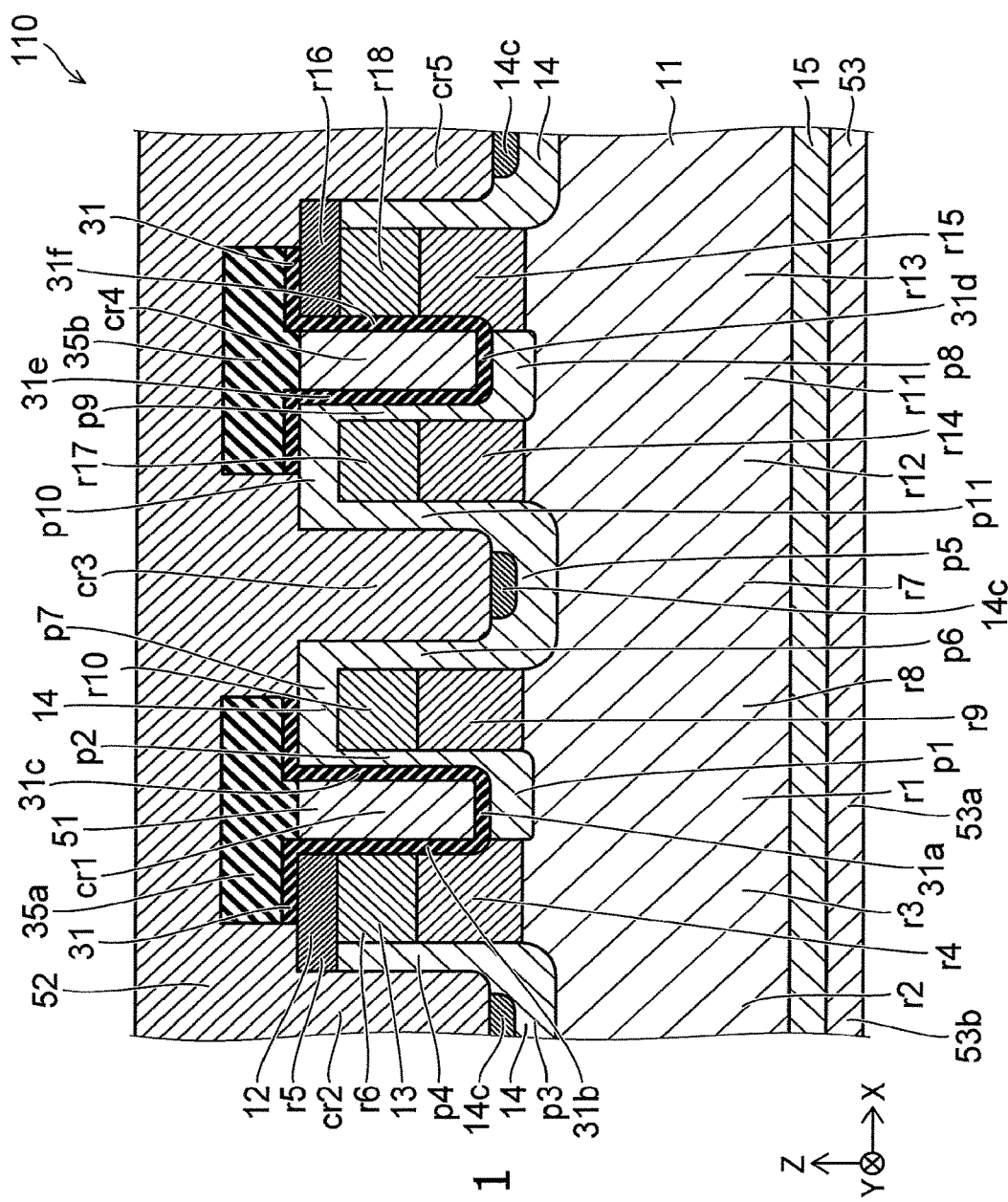
FIG. 1 is a schematic cross-sectional view illustrating a semiconductor device according to a first embodiment.

According to one embodiment, a semiconductor device includes first to third electrodes, first to fourth semiconductor regions, and a first insulating film. The first electrode includes a first conductive region. The second electrode includes a second conductive region. A first direction from a portion of the third electrode toward the first conductive region crosses a second direction from the second conductive region toward the first conductive region. A direction from another portion of the third electrode toward the second conductive region is aligned with the first direction. The first semiconductor region includes silicon carbide and is of a first conductivity type. The first semiconductor region includes first to fourth partial regions. The first partial region is positioned between the first conductive region and the portion of the third electrode in the first direction. The second partial region is positioned between the second conductive region and the other portion of the third electrode in the first direction. The third partial region is positioned between the first partial region and the second partial region in the second direction. A direction from the third partial region toward the fourth partial region is aligned with the first direction. A direction from the fourth partial region toward the first conductive region is aligned with the second direction. The second semiconductor region includes silicon carbide and is of the first conductivity type. The second semiconductor region includes a fifth partial region. The fourth partial region is positioned between the third partial region and the fifth partial region in the first direction. A direction from the fifth partial region toward the first conductive region is aligned with the second direction. The third semiconductor region includes silicon carbide and is of a second conductivity type. The third semiconductor region includes a sixth partial region provided between the fourth partial region and the fifth partial region in the first direction. The fourth semiconductor region includes silicon carbide and is of the second conductivity type. The fourth semiconductor region is electrically connected to the second conductive region, and includes a first portion and a second portion. The first portion is positioned between the first partial region and the first conductive region in the first direction. A direction from the first conductive region toward the second portion is aligned with the second direction. The second portion is continuous with the first portion. The first insulating film includes first to third insulating regions. The first insulating region is positioned between the first portion and the first conductive region. The second insulating region contacts the fourth partial region and the sixth partial region. The second insulating region is positioned between the fourth partial region and the first conductive region, between the sixth partial region and the first conductive region, and between the fifth partial region and the first conductive region. The third insulating region is positioned between the second portion and the first conductive region.

According to another embodiment, a method for manufacturing a semiconductor device is disclosed. The method can include forming a first recess in a semiconductor layer, the first recess including a first side surface, a second side surface, and a bottom portion, the second side surface opposing the first side surface. The method can include forming a first mask layer, the first mask layer including a first side surface portion and a second side surface portion, the first side surface portion being positioned at the first side surface, the second side surface portion being positioned at the second side surface, the first mask layer not being provided at the bottom portion. The method can include forming a second mask layer on the first mask layer and the semiconductor layer, the second mask layer having an opening. The method can include removing the second side surface portion via the opening, and introducing an impurity into the second side surface and the bottom portion. In addition, the method can include forming a first insulating film on the first side surface, the second side surface, and the bottom portion, and forming a first conductive portion in a remaining space.

Various embodiments will be described hereinafter with reference to the accompanying drawings.

The drawings are schematic and conceptual; and the relationships between the thickness and width of portions, the proportions of sizes among portions, etc., are not necessarily the same as the actual values thereof. Further, the dimensions and proportions may be illustrated differently among drawings, even for identical portions.

In the specification and drawings, components similar to those described or illustrated in a drawing thereinabove are marked with like reference numerals, and a detailed description is omitted as appropriate.

First Embodiment

FIG. 1 is a schematic cross-sectional view illustrating a semiconductor device according to a first embodiment.

Figure 2A:
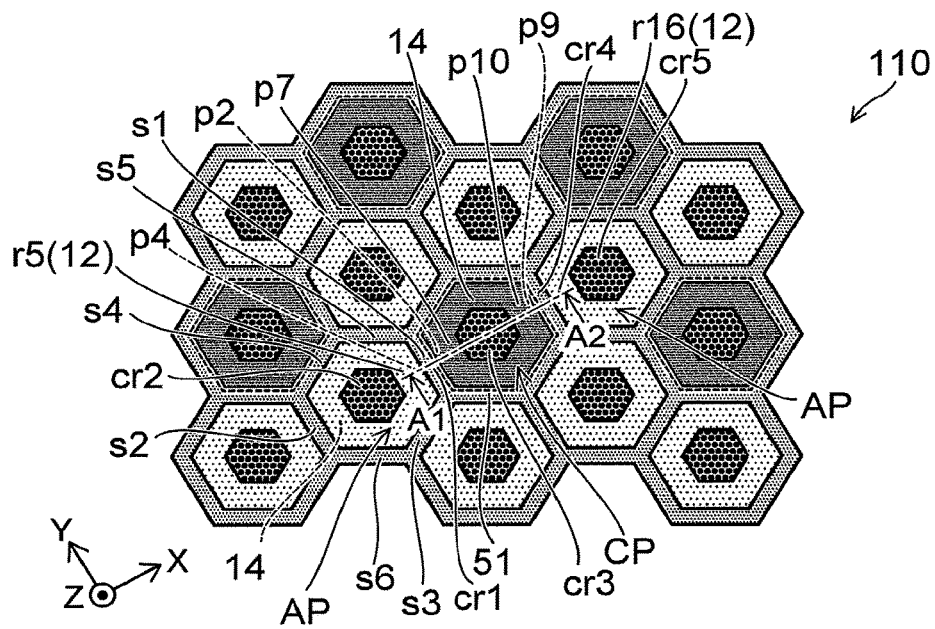
FIG. 2A and FIG. 2B are schematic views illustrating the semiconductor device according to the first embodiment.
Figure 2B:
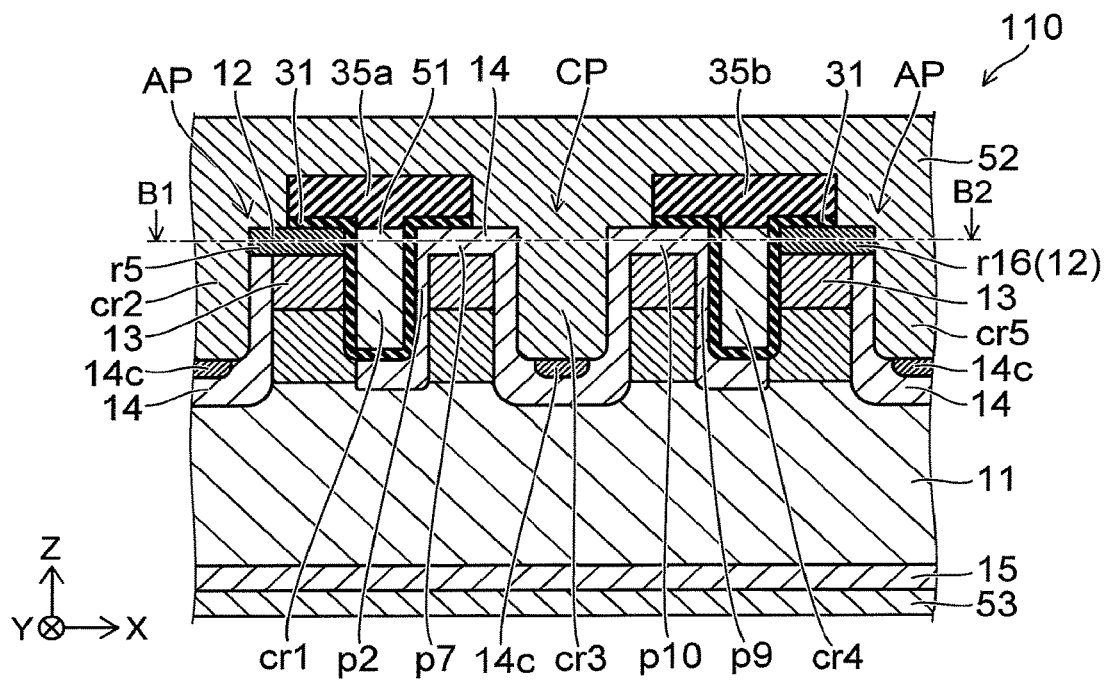

FIG. 2A and FIG. 2B are schematic views illustrating the semiconductor device according to the first embodiment.

FIG. 1 and FIG. 2B are cross-sectional views along line A1-A2 shown in FIG. 2A. FIG. 2A is a cross-sectional view along line B1-B2 of FIG. 2B. FIG. 1 is an enlarged view of FIG. 2B.

As shown in FIG. 2B, the semiconductor device 110 according to the embodiment includes a first electrode 51, a second electrode 52, a third electrode 53, a first semiconductor region 11, a second semiconductor region 12, a third semiconductor region 13, a fourth semiconductor region 14, and a first insulating film 31.

The first electrode 51 includes a first conductive region cr1. The second electrode 52 includes a second conductive region cr2.

As shown in FIG. 1, the direction from a portion 53a of the third electrode 53 toward the first conductive region cr1 is taken as a first direction.

The first direction is taken as a Z-axis direction. One direction perpendicular to the Z-axis direction is taken as an X-axis direction. A direction perpendicular to the Z-axis direction and the X-axis direction is taken as a Y-axis direction.

The first direction (the Z-axis direction) crosses a second direction from the second conductive region cr2 toward the first conductive region cr1. In the example, the second direction is the X-axis direction.

The direction from another portion 53b of the third electrode 53 toward the second conductive region cr2 is aligned with the first direction (the Z-axis direction).

The first semiconductor region 11 includes silicon carbide and is of a first conductivity type. The first semiconductor region 11 includes first to fourth partial regions r1 to r4.

The first partial region r1 is positioned between the first conductive region cr1 and the portion 53a of the third electrode 53 recited above in the first direction (the Z-axis direction). The second partial region r2 is positioned between the second conductive region cr2 and the other portion 53b of the third electrode 53 recited above in the first direction. The third partial region r3 is positioned between the first partial region r1 and the second partial region r2 in the second direction (the X-axis direction).

The direction from the third partial region r3 toward the fourth partial region r4 is aligned with the first direction (the Z-axis direction). The direction from the fourth partial region r4 toward the first conductive region cr1 is aligned with the second direction (the X-axis direction).

The second semiconductor region 12 includes silicon carbide and is of the first conductivity type. The second semiconductor region 12 includes a fifth partial region r5. The fourth partial region r4 is positioned between the third partial region r3 and the fifth partial region r5 in the first direction (the Z-axis direction). The direction from the fifth partial region r5 toward the first conductive region cr1 is aligned with the second direction (the X-axis direction).

The third semiconductor region 13 includes silicon carbide and is of a second conductivity type. For example, the first conductivity type is an n-type; and the second conductivity type is a p-type. The first conductivity type may be the p-type; and the second conductivity type may be the n-type. Hereinbelow, the first conductivity type is taken to be the n-type; and the second conductivity type is taken to be the p-type.

The third semiconductor region 13 includes a sixth partial region r6. The sixth partial region r6 is provided between the fourth partial region r4 and the fifth partial region r5 in the first direction (the Z-axis direction).

The fourth semiconductor region 14 includes silicon carbide and is of the second conductivity type. The fourth semiconductor region 14 is electrically connected to the second conductive region cr2. The fourth semiconductor region 14 includes a first portion p1 and a second portion p2. In the example, the fourth semiconductor region 14 further includes a third portion p3 and a fourth portion p4.

The first portion p1 is positioned between the first partial region r1 and the first conductive region cr1 in the first direction (the Z-axis direction). The direction from the first conductive region cr1 toward the second portion p2 is aligned with the second direction (the X-axis direction). The second portion p2 is continuous with the first portion p1.

The third portion p3 is positioned between the second partial region r2 and the second conductive region cr2 in the first direction (the Z-axis direction). The first conductive region cr1 is positioned between the fourth portion p4 and the second portion p2 in the second direction (the X-axis direction). In the example, the fourth partial region r4 and the sixth partial region r6 are positioned between the fourth portion p4 and the first conductive region cr1 in the second direction. The fourth portion p4 is continuous with the third portion p3.

The first insulating film 31 includes first to third insulating regions 31a to 31c. The first insulating region 31a is positioned between the first portion p1 and the first conductive region cr1. The second insulating region 31b is positioned between the fourth partial region r4 and the first conductive region cr1, between the sixth partial region r6 and the first conductive region cr1, and between the fifth partial region r5 and the first conductive region cr1. The second insulating region 31b contacts the fourth partial region r4 and the sixth partial region r6. In the example, the second insulating region 31b further contacts the fifth partial region r5. The third insulating region 31c is positioned between the second portion p2 and the first conductive region cr1.

In the semiconductor device 110, for example, the first electrode 51 functions as a gate electrode. For example, the second electrode 52 functions as a source electrode. For example, the third electrode 53 functions as a drain electrode. The semiconductor device 110 is, for example, a trench gate-type transistor.

In the example, the semiconductor device 110 further includes a fifth semiconductor region 15. The fifth semiconductor region 15 is provided between the third electrode 53 and the first semiconductor region 11. For example, the fifth semiconductor region 15 is of the first conductivity type. The semiconductor device 110 is, for example, a MOS transistor. As described below, the fifth semiconductor region 15 may be of the second conductivity type.

For example, the impurity concentration of the second conductivity type in the fourth semiconductor region 14 is higher than the impurity concentration of the second conductivity type in the third semiconductor region 13 (the sixth partial region r6). The fourth semiconductor region 14 is, for example, a $p^+$-type semiconductor region. The third semiconductor region 13 (the sixth partial region r6) is, for example, a p-type semiconductor region.

In the example, a second conductivity-type region 14c is provided between the fourth semiconductor region 14 and the second electrode 52. For example, one second conductivity-type region 14c is positioned between the third portion p3 and the second conductive region cr2 in the first direction (the Z-axis direction). The second conductivity-type region 14c functions as a contact region between the fourth semiconductor region 14 and the second electrode 52. For example, the impurity concentration of the second conductivity type in the second conductivity-type region 14c is higher than the impurity concentration of the second conductivity type in the fourth semiconductor region 14. The second conductivity-type region 14c is, for example, a $p^{++}$-region.

For example, the impurity concentration of the first conductivity type in the second semiconductor region 12 (the fifth partial region r5) is higher than the impurity concentration of the first conductivity type in the first partial region r1 of the first semiconductor region 11. The second semiconductor region 12 (the fifth partial region r5) is, for example, an $n^+$-type semiconductor region. The first partial region r1 is, for example, an $n^-$-type semiconductor region.

For example, the impurity concentration of the first conductivity type in the fourth partial region r4 is higher than the impurity concentration of the first conductivity type in the first partial region r1. The fourth partial region r4 is, for example, an n-type semiconductor region.

The n-type impurity includes, for example, at least one selected from the group consisting of N, P, and As. The p-type impurity includes, for example, at least one selected from the group consisting of B, Al, and Ga.

In the semiconductor device 110, a portion of the first conductive region cr1 functions as the gate electrode of the transistor. Another portion of the first conductive region cr1 does not function as the gate electrode of the transistor. The second portion p2 of the fourth semiconductor region 14 ($p^+$) is provided at the other portion with the third insulating region 31c interposed. The first portion p1 is electrically connected to the second electrode 52 via the second portion p2. The second portion p2 functions as a connection portion.

The first portion p1 can be connected to the second electrode 52 with high density by such a configuration. For example, the second electrode 52 is set to a ground potential. According to the embodiment, grounding with high density is possible. For example, the switching loss can be reduced. For example, high-speed switching is possible.

In the embodiment, the portions that function as the gate electrode can be arranged at high density. For example, the portions that function as the channel can be provided at high density. Thereby, for example, a low on-resistance is obtained. A semiconductor device can be provided in which the on-resistance can be reduced. For example, a low "characteristic on-resistance" is obtained. According to the embodiment, for example, a low switching loss and a low characteristic on-resistance are obtained.

As shown in FIG. 2A, the first electrode 51 is positioned around the second conductive region cr2 in a plane (e.g., the X-Y plane) crossing the first direction (the Z-axis direction). For example, the first electrode 51 surrounds the second conductive region cr2 in the plane crossing the first direction.

In the example, the first electrode 51 includes first to sixth sides s1 to s6 in a plane (the X-Y plane) crossing the first direction. The second side s2 extends in the direction in which the first side s1 extends. The fourth side s4 extends in the direction in which the third side s3 extends. The sixth side s6 extends in the direction in which the fifth side s5 extends.

The third side s3 is connected to the first side s1 and the sixth side s6. The fifth side s5 is connected to the first side s1 and the fourth side s4. The second side s2 is connected to the fourth side s4 and the sixth side s6.

The second conductive region cr2 is positioned between the first side s1 and the second side s2. The second conductive region cr2 is positioned between the third side s3 and the fourth side s4. The second conductive region cr2 is positioned between the fifth side s5 and the sixth side s6. A portion of the first electrode 51 is, for example, a hexagon.

For example, one of the crystal orientations (e.g., the a-axis) of the first semiconductor region 11 may be aligned with the direction in which the first side s1 extends. The nn-axis of the first semiconductor region 11 may be aligned with the direction in which the first side s1 extends.

For example, a portion of the fourth semiconductor region 14 is provided around the second conductive region cr2 in a plane (e.g., the X-Y plane) crossing the first direction (the Z-axis direction). A portion of the fourth semiconductor region 14 surrounds the second conductive region cr2 in the plane crossing the first direction.

For example, the fourth portion p4 of the fourth semiconductor region 14 may be continuous with the second portion p2 of the fourth semiconductor region 14.

As shown in FIG. 1, the fourth portion p4 is positioned under the fifth partial region r5. For example, the fourth portion p4 is positioned between the fifth partial region r5 and the first semiconductor region 11 in the first direction (the Z-axis direction).

In the example, at least a portion of the fourth partial region r4 is positioned between the second conductive region cr2 and the first conductive region cr1 in the second direction (e.g., the X-axis direction).

The sixth partial region r6 is positioned between the second conductive region cr2 and the first conductive region cr1 in the second direction. The fifth partial region r5 is positioned between the second conductive region cr2 and the first conductive region cr1 in the second direction.

As shown in FIG. 1, other conductive portions, other partial regions, etc., are further provided in the example. Examples of these portions will now be described.

As shown in FIG. 1, the second electrode 52 further includes a third conductive region cr3 in addition to the second conductive region cr2. The first semiconductor region 11 further includes seventh to ninth partial regions r7 to r9. The third semiconductor region 13 further includes a tenth partial region r10. The fourth semiconductor region 14 further includes fifth to seventh portions p5 to p7.

The first partial region r1 is positioned between the third partial region r3 and the seventh partial region r7 in the second direction (e.g., the X-axis direction). The eighth partial region r8 is positioned between the first partial region r1 and the seventh partial region r7 in the second direction.

The ninth partial region r9 is positioned between the eighth partial region r8 and the tenth partial region r10 (a portion of the third semiconductor region 13) in the first direction (the Z-axis direction).

The direction from the seventh partial region r7 toward the third conductive region cr3 is aligned with the first direction (the Z-axis direction). The fifth portion p5 (a portion of the fourth semiconductor region 14) is positioned between the seventh partial region r7 and the third conductive region cr3 in the first direction.

At least a portion of the tenth partial region r10 is positioned between the second portion p2 and the third conductive region cr3 in the second direction. The sixth portion p6 (a portion of the fourth semiconductor region 14) is positioned between the third conductive region cr3 and the at least a portion of the tenth partial region r10 in the second direction. The tenth partial region r10 (a portion of the third semiconductor region 13) is positioned between the ninth partial region r9 and the seventh portion p7 (a portion of the fourth semiconductor region 14) in the first direction.

For example, the seventh portion p7 is continuous with the second portion p2 and the sixth portion p6. The sixth portion p6 is continuous with the seventh portion p7 and the fifth portion p5.

For example, one second conductivity-type region 14c is positioned between the fifth portion p5 and the third conductive region cr3 in the first direction (the Z-axis direction).

In the example, the first electrode 51 further includes a fourth conductive region cr4 in addition to the first conductive region cr1. The second electrode 52 further includes a fifth conductive region cr5. The first semiconductor region 11 further includes eleventh to fifteenth partial regions r11 to r15. The second semiconductor region 12 includes a sixteenth partial region r16. The third semiconductor region 13 further includes a seventeenth partial region r17 and an eighteenth partial region r18. The fourth semiconductor region 14 further includes eighth to eleventh portions p8 to p11. The first insulating film 31 further includes fourth to sixth insulating regions 31d to 31f.

The seventh partial region r7 is positioned between the eighth partial region r8 and the thirteenth partial region r13 in the second direction (e.g., the X-axis direction). The eleventh partial region r11 is positioned between the seventh partial region r7 and the thirteenth partial region r13 in the second direction. The twelfth partial region r12 is positioned between the seventh partial region r7 and the eleventh partial region r11 in the second direction.

The direction from the eleventh partial region r11 toward the fourth conductive region cr4 is aligned with the first direction (the Z-axis direction).

The seventeenth partial region r17 is positioned between the third conductive region cr3 and the fourth conductive region cr4 in the second direction (e.g., the X-axis direction). The fourteenth partial region r14 is positioned between the twelfth partial region r12 and the seventeenth partial region r17 in the first direction (the Z-axis direction). The direction from at least a portion of the fourteenth partial region r14 toward the fourth conductive region cr4 is aligned with the second direction (the X-axis direction).

The direction from the thirteenth partial region r13 toward the sixteenth partial region r16 (a portion of the second semiconductor region 12) is aligned with the first direction (the Z-axis direction). The fifteenth partial region r15 (a portion of the first semiconductor region 11) is positioned between the thirteenth partial region r13 and the sixteenth partial region r16 in the first direction. The eighteenth partial region r18 (a portion of the third semiconductor region 13) is positioned between the fifteenth partial region r15 and the sixteenth partial region r16 in the first direction.

The eighth portion p8 (a portion of the fourth semiconductor region 14) is positioned between the eleventh partial region r11 and the fourth conductive region cr4 in the first direction. The ninth portion p9 (a portion of the fourth semiconductor region 14) is positioned between the fourth conductive region cr4 and at least a portion of the seventeenth partial region r17 in the second direction (the X-axis direction).

The seventeenth partial region r17 (a portion of the third semiconductor region 13) is positioned between the tenth portion p10 (a portion of the fourth semiconductor region 14) and the fourteenth partial region r14 in the first direction (the Z-axis direction).

The third conductive region cr3 is positioned between the sixth portion p6 and the eleventh portion p11 in the second direction (the X-axis direction). For example, the eleventh portion p11 is continuous with the fifth portion p5 and the tenth portion p10.

The fourth conductive region cr4 is positioned between the seventeenth partial region r17 and the eighteenth partial region r18 in the second direction (e.g., the X-axis direction). The fourth conductive region cr4 is positioned between the fourteenth partial region r14 and the fifteenth partial region r15 in the second direction.

The fourth insulating region 31d is positioned between the eighth portion p8 and the fourth conductive region cr4. The fifth insulating region 31e is positioned between the ninth portion p9 and the fourth conductive region cr4. The sixth insulating region 31f is positioned between the fifteenth partial region r15 and the fourth conductive region cr4, between the sixteenth partial region r16 and the fourth conductive region cr4, and between the eighteenth partial region r18 and the fourth conductive region cr4. The sixth insulating region 31f contacts the fifteenth partial region r15, the sixteenth partial region r16, and the eighteenth partial region r18.

The third conductive region cr3 is positioned between the first conductive region cr1 and the fifth conductive region cr5 in the second direction (the X-axis direction). The fourth conductive region cr4 is positioned between the third conductive region cr3 and the fifth conductive region cr5 in the second direction.

For example, at least a portion of the fifteenth partial region r15 is positioned between the fourth conductive region cr4 and at least a portion of the fifth conductive region cr5 in the X-axis direction. For example, at least a portion of the eighteenth partial region r18 is positioned between the fourth conductive region cr4 and at least a portion of the fifth conductive region cr5 in the X-axis direction. For example, a portion of the fourth semiconductor region 14 is positioned between the sixteenth partial region r16 and the first semiconductor region 11 in the first direction (the Z-axis direction).

For example, one second conductivity-type region 14c is positioned between the fourth semiconductor region 14 and the fifth conductive region cr5 in the first direction (the Z-axis direction).

As described above, a portion of the first conductive region cr1 functions as the gate electrode of the transistor. The second portion p2 is provided at another portion of the first conductive region cr1 with the third insulating region 31c interposed. The second portion p2 functions as a connection portion. For example, a portion of the fourth conductive region cr4 functions as the gate electrode of the transistor. The ninth portion p9 is provided at another portion of the fourth conductive region cr4 with the fifth insulating region 31e interposed. The ninth portion p9 functions as a connection portion.

The region that is between the second portion p2 and the ninth portion p9 corresponds to a connection portion CP to the second electrode 52 (referring to FIG. 2A and FIG. 2B). For example, the third conductive region cr3 is at least a portion of the connection portion CP. The second conductive region cr2 and the fifth conductive region cr5 are at least a portion of an operation portion AP.

In the example as shown in FIG. 2A, two operation portions AP are provided between two connection portions CP when viewed along the X-axis direction. As described below, the number of the operation portions AP provided between the two connection portions CP is modifiable.

As shown in FIG. 2B, a second insulating film 35a and a third insulating film 35b are provided in the example. The second insulating film 35a is provided between the second electrode 52 and the first conductive region cr1. The third insulating film 35b is provided between the second electrode 52 and the fourth conductive region cr4. The first electrode 51 and the second electrode 52 are electrically insulated.

Second Embodiment

The second embodiment relates to a method for manufacturing a semiconductor device. An example of the method for manufacturing the semiconductor device 110 will now be described.

FIG. 3A, FIG. 3B, FIG. 4A, FIG. 4B, FIG. 5A, FIG. 5B, FIG. 6A, FIG. 6B, FIG. 7A, FIG. 7B, and FIG. 8 are schematic cross-sectional views illustrating the method for manufacturing the semiconductor device according to the second embodiment.

Figure 3A:
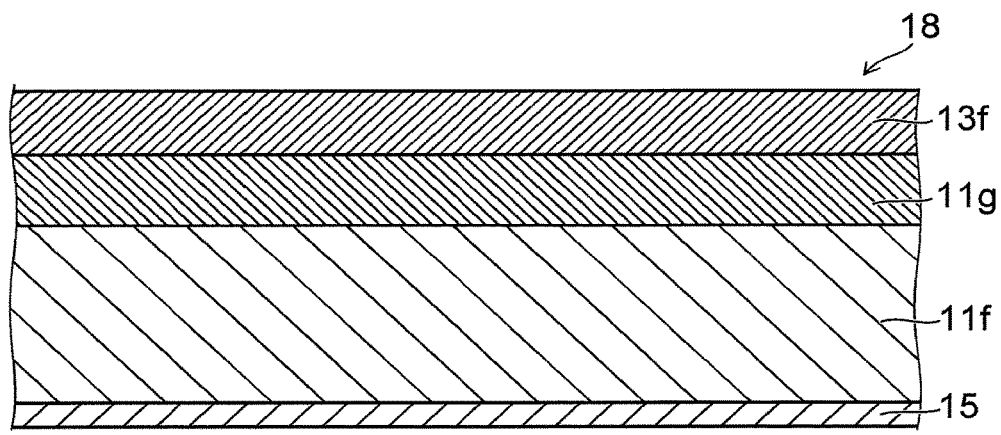
FIG. 3A and FIG. 3B are schematic cross-sectional views illustrating the method for manufacturing the semiconductor device according to the second embodiment.

A semiconductor layer 18 is prepared as shown in FIG. 3A. In the example, the semiconductor layer 18 includes the fifth semiconductor region 15, a semiconductor region 11f, a semiconductor region 11g, and a semiconductor region 13f. The fifth semiconductor region 15 is, for example, an $n^+$-type semiconductor region. The semiconductor region 11f is, for example, an $n^-$-type semiconductor region. The semiconductor region 11g is an n-type semiconductor region. The semiconductor region 13f is a p-type semiconductor region. The semiconductor region 11f, the semiconductor region 11g, and the semiconductor region 13f are provided in this order on the fifth semiconductor region 15. The semiconductor layer 18 (the semiconductor regions recited above) includes silicon carbide.

Figure 3B:
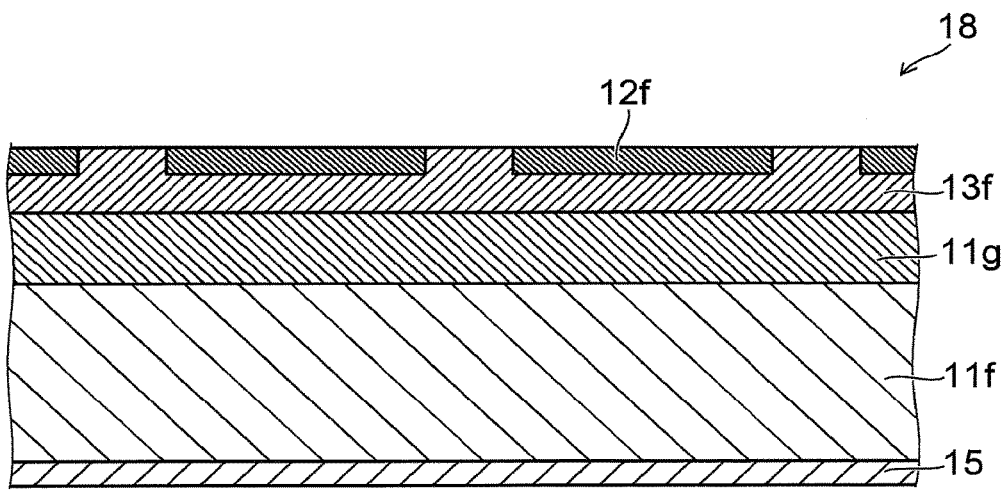

As shown in FIG. 3B, a p-type impurity is introduced to a portion of the upper surface of the semiconductor layer 18. The p-type impurity is, for example, Al. The p-type impurity may be, for example, at least one selected from the group consisting of Al, B, and Ga. The region where the p-type impurity is introduced becomes a semiconductor region 12f.

Figure 4A:
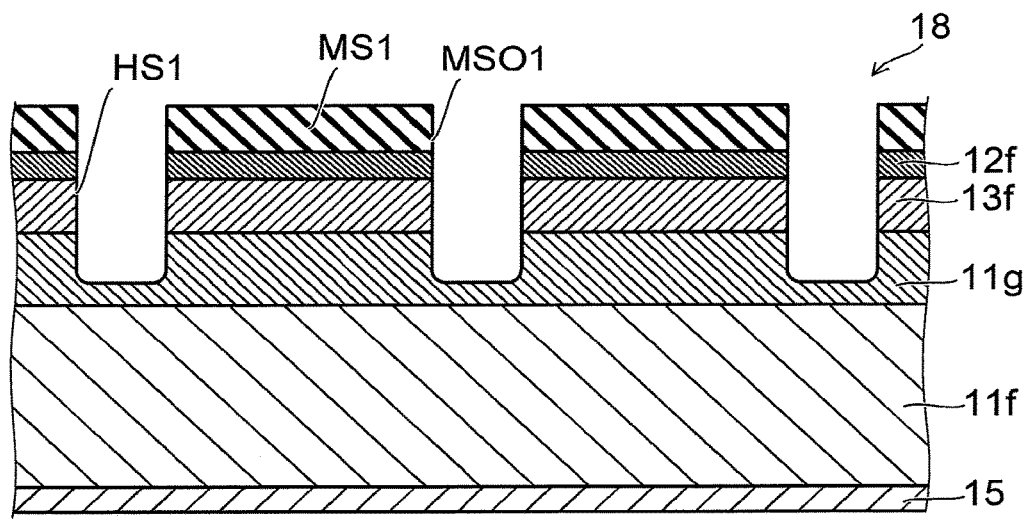
FIG. 4A and FIG. 4B are schematic cross-sectional views illustrating the method for manufacturing the semiconductor device according to the second embodiment.

As shown in FIG. 4A, recesses HS1 are formed in the semiconductor layer 18. For example, the recess HS1 is formed by forming a mask MS1 having an opening MSO1 on the semiconductor layer 18, and by removing a portion of the semiconductor layer 18 via the opening MSO1. For example, the recesses HS1 are formed at the positions where the second conductive region cr2, the third conductive region cr3, and the fifth conductive region cr5 are to be formed. The recess HS1 is, for example, a source trench. In the example, the bottom portion of the recess HS1 reaches the semiconductor region 11g. The mask MS1 includes, for example, silicon oxide.

Figure 4B:
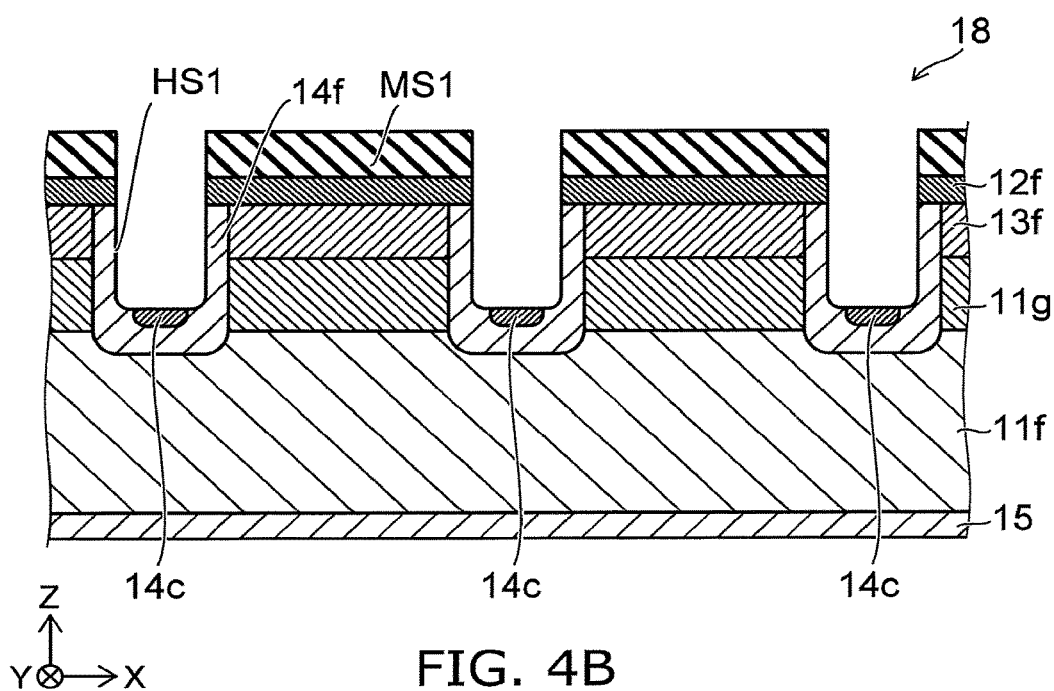

As shown in FIG. 4B, tilted implantation of an impurity of the second conductivity type (the p-type) is performed. A semiconductor region 14f of the second conductivity type is formed on the bottom surface and the side surface of the recess HS1. The second conductivity-type region 14c may be further provided. The semiconductor region 14f is used to form a portion of the fourth semiconductor region 14. For example, the mask MS1 is removed.

Figure 5A:
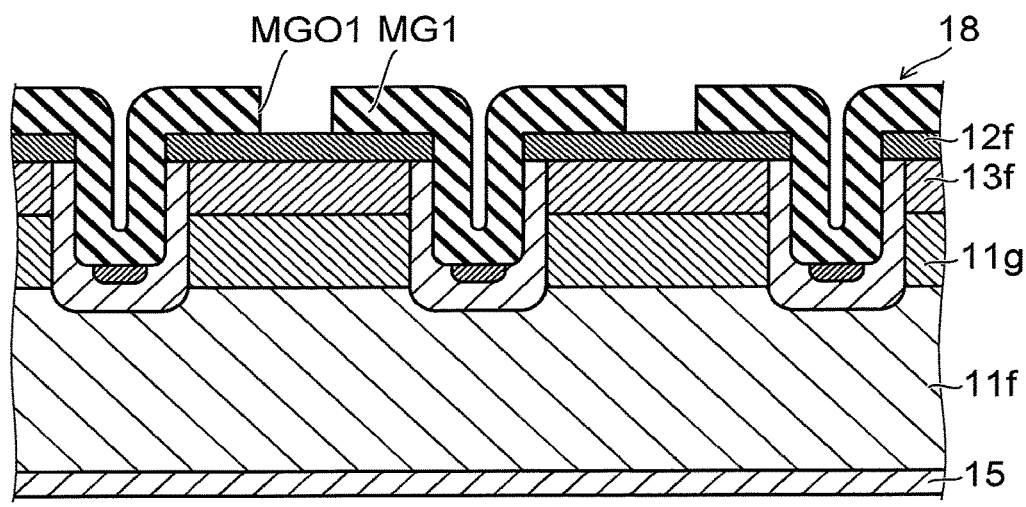
FIG. 5A and FIG. 5B are schematic cross-sectional views illustrating the method for manufacturing the semiconductor device according to the second embodiment.

As shown in FIG. 5A, a mask MG1 is formed on the semiconductor layer 18. The mask MG1 has openings MGO1. The openings MGO1 are provided in regions not on the recesses HS1. The positions of the openings MGO1 correspond to the positions where the first conductive region cr1 and the fourth conductive region cr4 are to be formed. The mask MG1 includes, for example, silicon oxide.

Figure 5B:
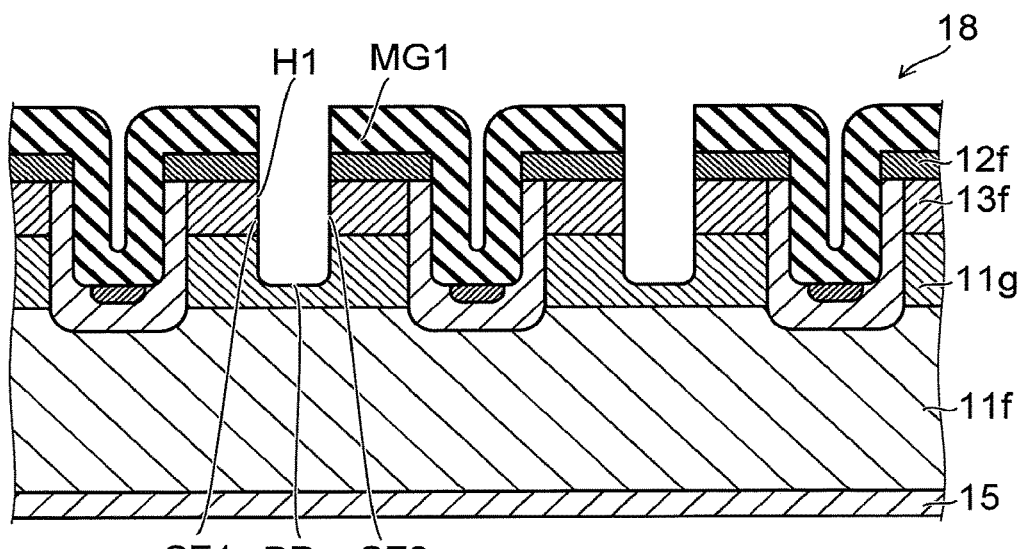

As shown in FIG. 5B, a portion of the semiconductor layer 18 is removed via the opening MGO1 of the mask MG1. Thereby, a first recess H1 is formed in the semiconductor layer 18. The first recess H1 includes a first side surface SF1, a second side surface SF2, and a bottom portion BP. The second side surface SF2 opposes the first side surface SF1. For example, the direction from the first side surface SF1 toward the second side surface SF2 is aligned with the X-axis direction.

Figure 6A:
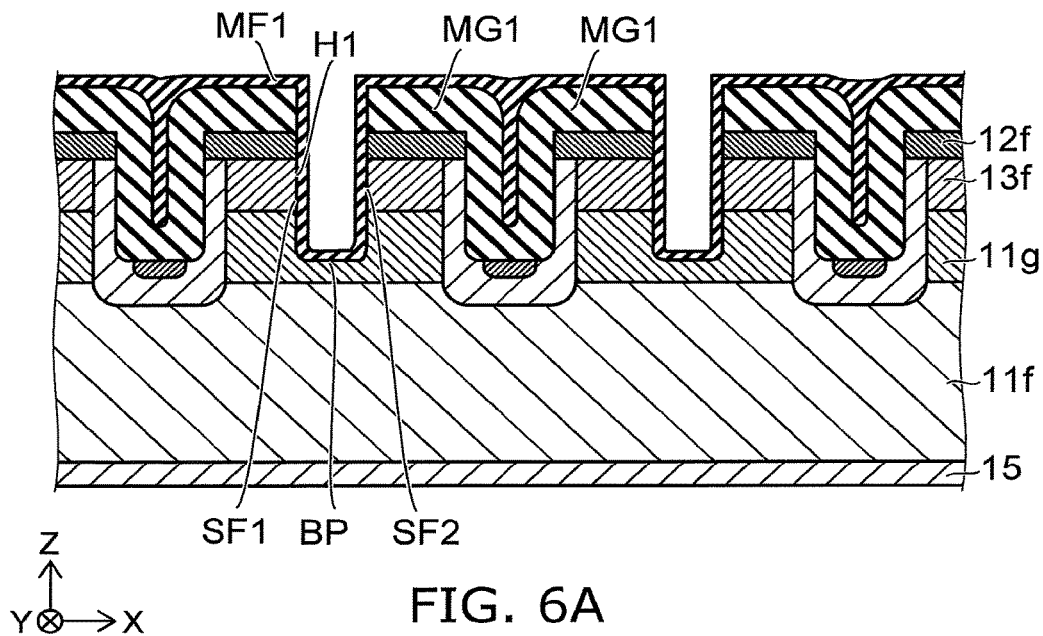
FIG. 6A and FIG. 6B are schematic cross-sectional views illustrating the method for manufacturing the semiconductor device according to the second embodiment.

A mask film MF1 is formed as shown in FIG. 6A. The thickness of the mask film MF1 is relatively thin. A space remains in the first recess H1 even after the mask film MF1 is formed. The mask film MF1 includes, for example, silicon oxide.

Figure 6B:
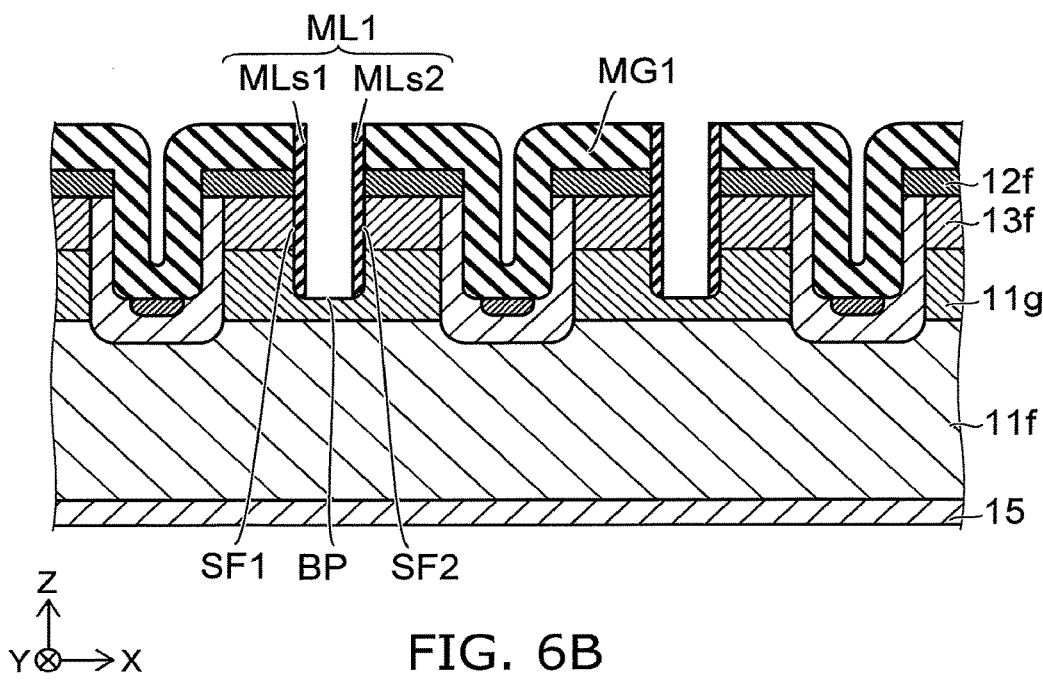

As shown in FIG. 6B, a portion of the mask film MF1 is removed by anisotropic etching. Thereby, a first mask layer ML1 is formed from the mask film MF1.

Thus, in the manufacturing method according to the embodiment, the first mask layer ML1 is formed after the first recess H1 is formed in the semiconductor layer 18. The first mask layer ML1 includes a first side surface portion MLs1 and a second side surface portion MLs2. The first side surface portion MLs1 is positioned on the first side surface SF1. The second side surface portion MLs2 is positioned on the second side surface SF2. The first mask layer ML1 is not provided on the bottom portion BP of the first recess H1. In other words, the mask film MF1 that is positioned at the bottom portion BP of the first recess H1 is removed by the anisotropic etching.

Figure 7A:
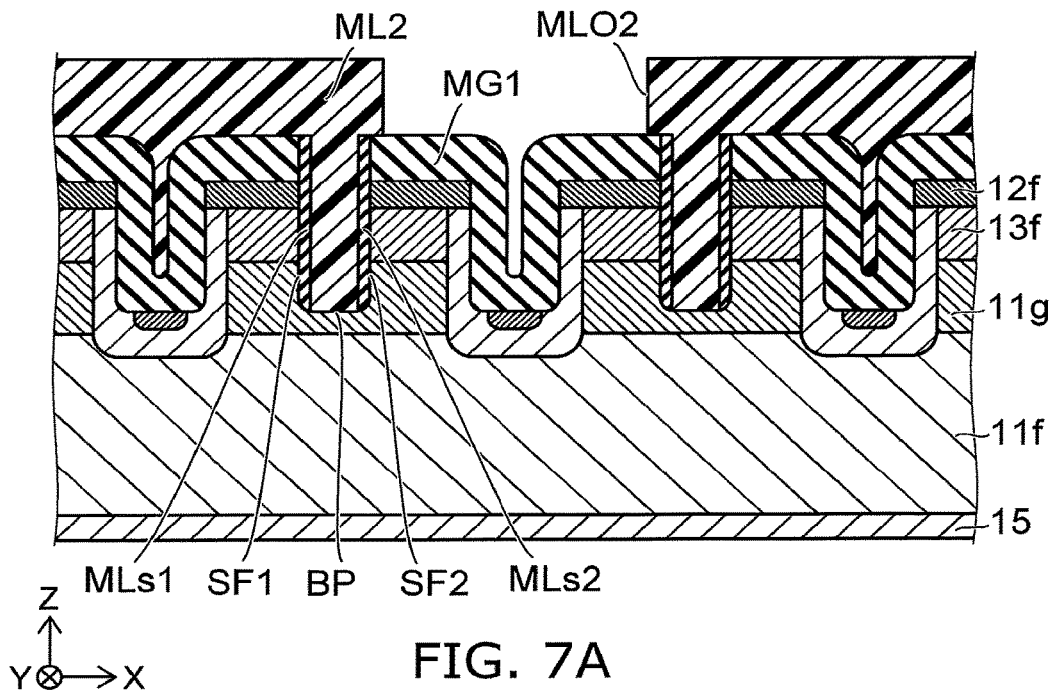
FIG. 7A and FIG. 7B are schematic cross-sectional views illustrating the method for manufacturing the semiconductor device according to the second embodiment.

As shown in FIG. 7A, a second mask layer ML2 is formed on the first mask layer ML1 and the semiconductor layer 18. The second mask layer ML2 has an opening MLO2. The position of the opening MLO2 corresponds to the position of the connection portion CP. The second mask layer ML2 includes, for example, a resist material.

Figure 7B:
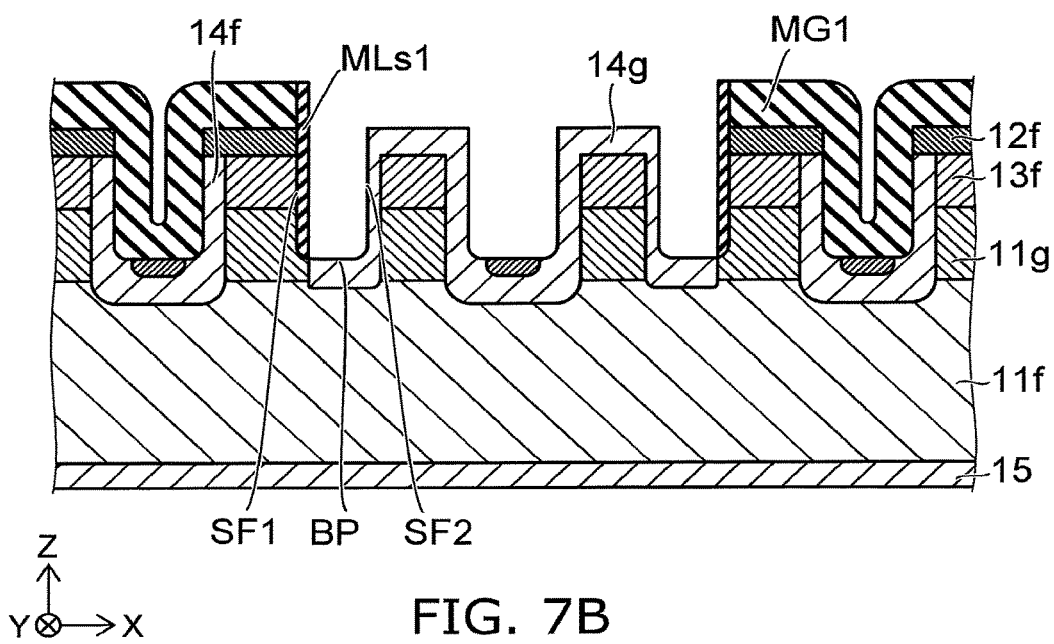

As shown in FIG. 7B, etching is performed via the opening MLO2. For example, wet etching is performed using buffered hydrofluoric acid (BHF). Thereby, a portion of the mask MG1 is removed. Further, the second side surface portion MLs2 is removed as the etching progresses.

The first side surface portion MLs1 remains in the etching. Thus, in the embodiment, the second side surface portion MLs2 is removed via the opening MLO2. Subsequently, the second mask layer ML2 is removed. The second side surface SF2 and the bottom portion BP of the first recess H1 are exposed.

As shown in FIG. 7B, an impurity is introduced to the second side surface SF2 and the bottom portion BP. For example, the impurity is of the second conductivity type. The impurity is, for example, Al. The impurity may be, for example, at least one selected from the group consisting of Al, B, and Ga. Thereby, a semiconductor region 14g (the region where the impurity is introduced) is formed. The semiconductor region 14f and the semiconductor region 14g are used to form the fourth semiconductor region 14.

The first side surface SF1 is covered with the first side surface portion MLs1 when introducing the impurity into the second side surface SF2 and the bottom portion BP. Therefore, the semiconductor region 14g is not formed on the first side surface SF1.

For example, the first side surface portion MLs1 is removed.

Figure 8:
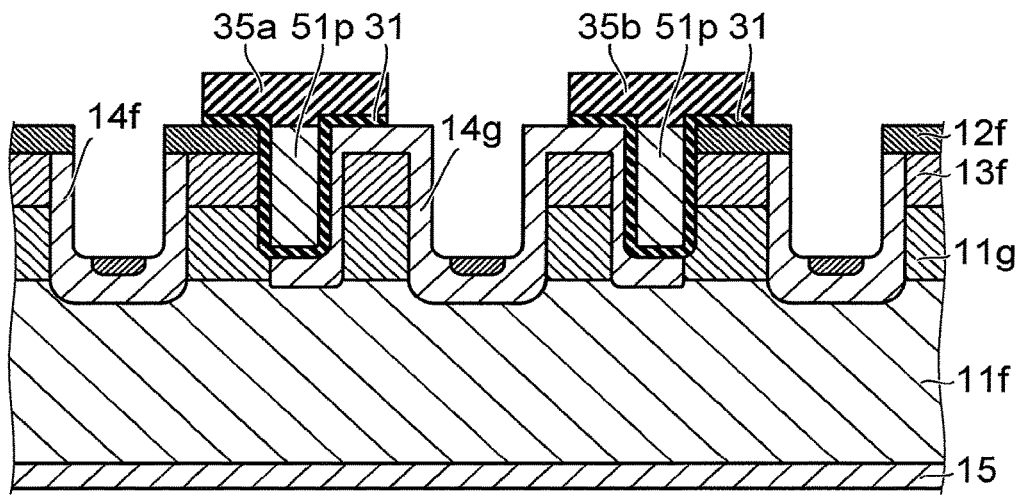
FIG. 8 is a schematic cross-sectional view illustrating the method for manufacturing the semiconductor device according to the second embodiment.

An insulating film that is used to form the first insulating film 31 is formed as shown in FIG. 8. The insulating film is formed on the first side surface SF1, the second side surface SF2, and the bottom portion BP. Further, a first conductive portion 51p is formed in the remaining space. The first conductive portion 51p is used to form the first conductive region cr1, the fourth conductive region cr4, etc. The second insulating film 35a and the third insulating film 35b are formed. The insulating film that is used to form the first insulating film 31 also is patterned in the patterning of these insulating films. Thereby, the first insulating film 31 is formed. Subsequently, a conductive member that is used to form the second electrode is formed. Thereby, the semiconductor device 110 is obtained.

In FIG. 8, the semiconductor regions 11f and 11g are used to form the first semiconductor region 11. The semiconductor region 13f is used to form the third semiconductor region 13. The semiconductor region 12f is used to form the second semiconductor region 12. The semiconductor regions 14f and 14g are used to form the fourth semiconductor region 14.

According to the manufacturing method, the first side surface portion MLs1 can be formed with self-alignment. The second side surface portion MLs2 can be removed with self-alignment. The connection portion CP and the operation portion AP can be formed with high precision. A semiconductor device in which the switching loss can be reduced can be manufactured with high productivity.

In the manufacturing method recited above, the semiconductor layer 18 includes the first semiconductor region 11 (the semiconductor regions 11f and 11g) of the first conductivity type, the second semiconductor region 12 (the semiconductor region 12f) of the first conductivity type, and the third semiconductor region 13 (the semiconductor region 13f) of the second conductivity type. The third semiconductor region 13 (the semiconductor region 13f) is provided between the first semiconductor region 11 and the second semiconductor region 12.

As shown in FIG. 5B, the semiconductor region 11g, the semiconductor region 12f, and the semiconductor region 13f are exposed at the first side surface SF1.

As shown in FIG. 8, the first insulating film 31 is positioned between the first conductive portion 51p and the semiconductor region 11f (and 11g), between the first conductive portion 51p and the semiconductor region 12f, and between the first conductive portion 51p and the semiconductor region 13f. The first insulating film 31 contacts the semiconductor region 11f (and 11g), the semiconductor region 12f, and the semiconductor region 13f.

In FIG. 7B, the region (the semiconductor region 14g) where the impurity is introduced is of the second conductivity type (the p-type). The active portion is electrically connected to the second electrode 52 by the semiconductor region 14g.

A second conductive portion (the second electrode 52) is further formed in the embodiment (referring to FIG. 2B). The second conductive portion (the second electrode 52) is electrically connected to the region (the semiconductor region 14g) where the impurity is introduced.

At least a portion of the second conductive portion (the second electrode 52) may be filled into the trenches (the recesses). For example, as shown in FIG. 4A, a second recess (the recess HS1) is further formed in the semiconductor layer 18. At least a portion of the second conductive portion (the second electrode 52) is formed in the second recess (the recess HS1) (referring to FIG. 2B). In this process as shown in FIG. 4B, the semiconductor layer 18 includes a region (the semiconductor region 14f) of the second conductivity type. At least a portion of the region (the semiconductor region 14f) of the second conductivity type is positioned at the bottom of the second recess (the recess HS1).

The region (the semiconductor region 14f) of the second conductivity type positioned at the bottom of the second recess (the recess HS1) is formed to a deep position. For example, the electric field is relaxed at the first insulating film 31 positioned at the bottom portion of the first electrode 51. Damage of the first insulating film 31 is suppressed.

Several examples of the semiconductor device according to the first embodiment will now be described.

Figure 9:
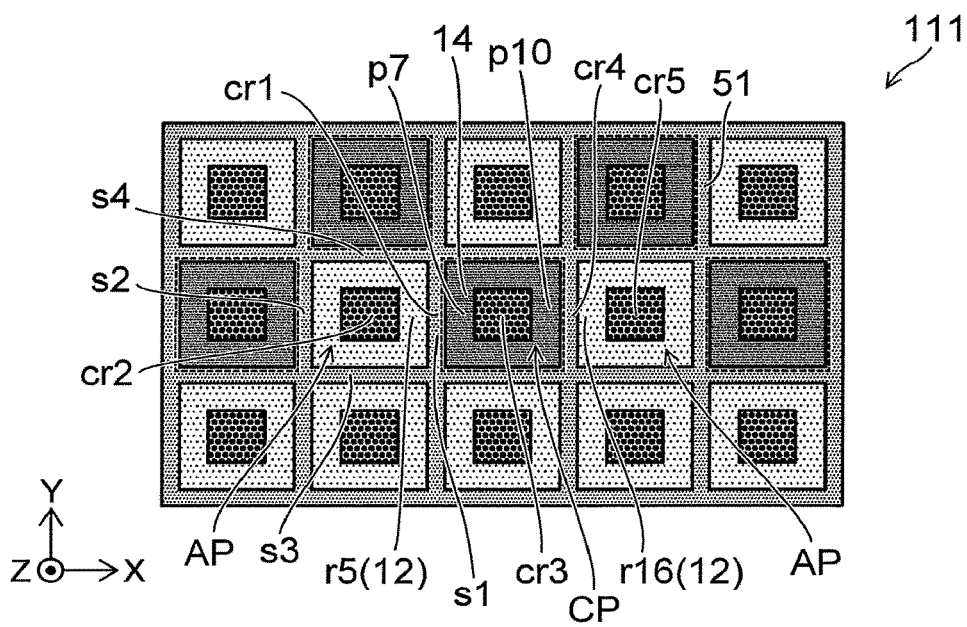
FIG. 9 is a schematic cross-sectional view illustrating another semiconductor device according to the first embodiment.

FIG. 9 is a schematic cross-sectional view illustrating another semiconductor device according to the first embodiment.

FIG. 9 is a cross-sectional view corresponding to FIG. 2A.

As shown in FIG. 9, the configuration of the first electrode 51 is a quadrilateral in the semiconductor device 111.

For example, the first electrode 51 includes the first to fourth sides s1 to s4 in a plane (the X-Y plane) crossing the first direction (the Z-axis direction). The second side s2 extends in the direction in which the first side s1 extends. The fourth side s4 extends in the direction in which the third side s3 extends. The third side s3 is connected to the first side s1 and the second side s2. The fourth side s4 is connected to the first side s1 and the second side s2. The second conductive region cr2 is positioned between the first side s1 and the second side s2. The second conductive region cr2 is positioned between the third side s3 and the fourth side s4. In the embodiment, it is favorable for the configuration of the first electrode 51 to be a hexagon or a quadrilateral.

Figure 10:
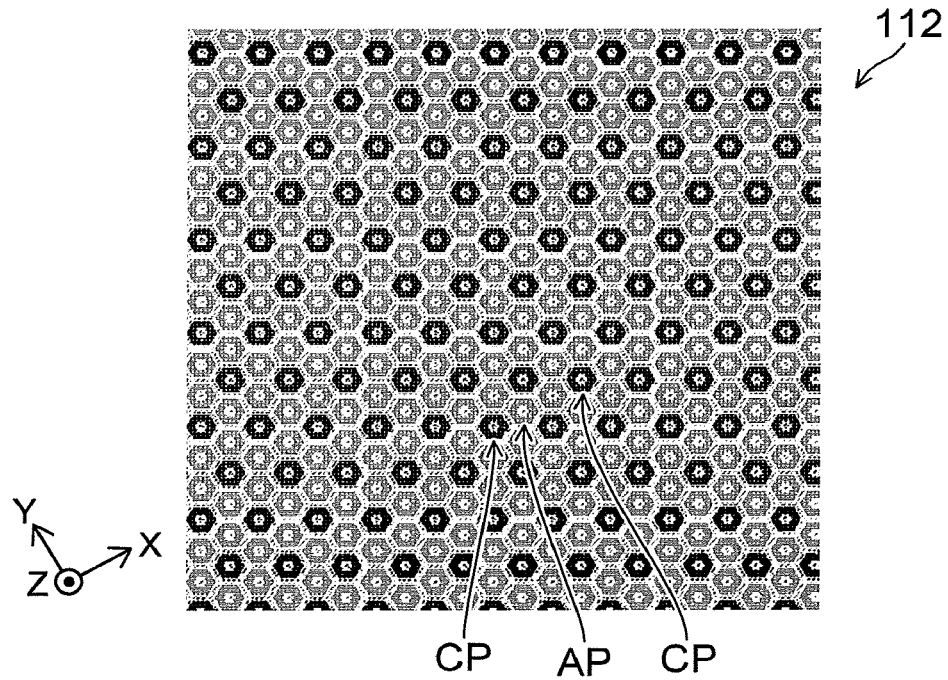
FIG. 10 is a schematic cross-sectional view illustrating other semiconductor devices according to the first embodiment.
Figure 11:
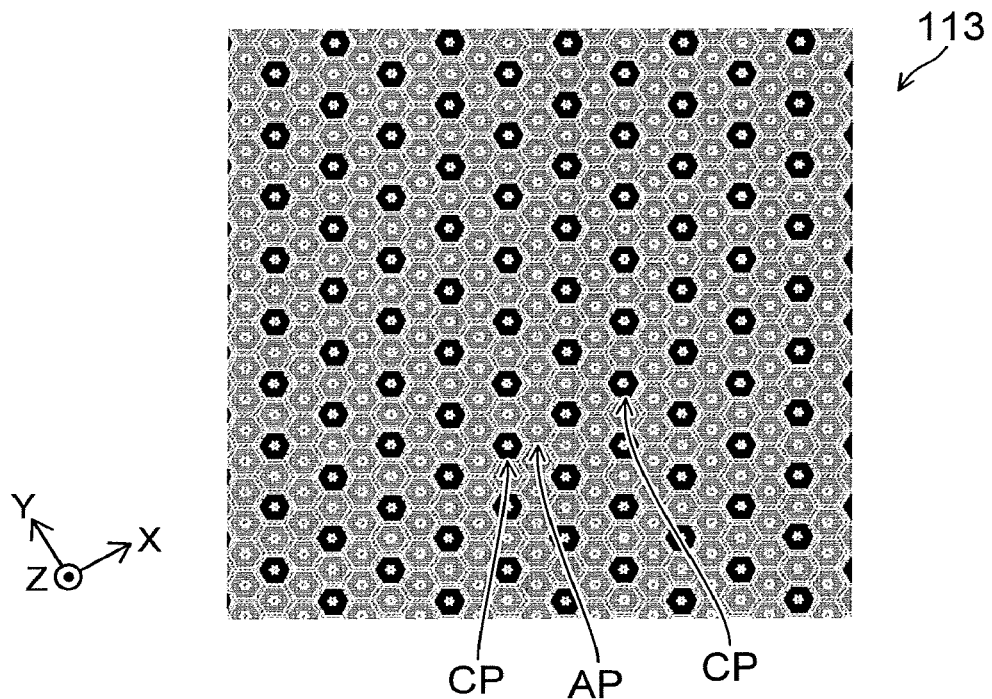
FIG. 11 is a schematic cross-sectional view illustrating other semiconductor devices according to the first embodiment.
Figure 12:
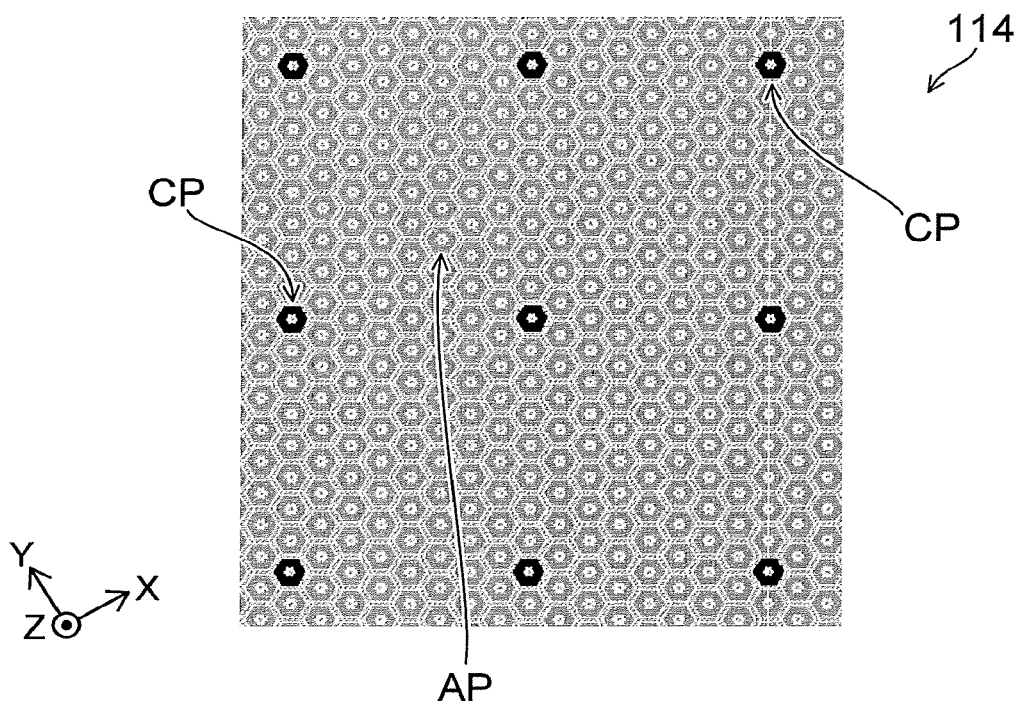
FIG. 12 is a schematic cross-sectional view illustrating other semiconductor devices according to the first embodiment.

FIG. 10 to FIG. 12 are schematic cross-sectional views illustrating other semiconductor devices according to the first embodiment.

In a semiconductor device 112 as shown in FIG. 10, two operation portions AP are provided between two connection portions CP. In a semiconductor device 113 as shown in FIG. 11, one operation portion AP is provided between two connection portions CP. In a semiconductor device 114 as shown in FIG. 12, fifteen operation portions AP are provided between two connection portions CP.

An example of simulation results of characteristics of the semiconductor device will now be described. The relationship between the switching loss and the path resistance (a semiconductor line resistance Rp) of the fourth semiconductor region 14 between the multiple gate trenches will now be described.

For example, in one gate trench (the trench corresponding to the first conductive region cr1 in FIG. 1), the p-type region at the bottom of the gate trench (the first portion p1 of FIG. 1) is linked to the second electrode 52 by the p-type region provided on the side wall on one side of the gate trench (the second portion p2 of FIG. 1). For example, in another one gate trench (the trench corresponding to the fourth conductive region cr4 in FIG. 1), the p-type region at the bottom of the gate trench (the eighth portion p8 of FIG. 1) is linked to the second electrode 52 by the p-type region provided on the side wall on one side of the gate trench (the ninth portion p9 of FIG. 1). The resistance of the path between the p-type region at the bottom of the first gate trench (the first portion p1 of FIG. 1) and the p-type region at the bottom of the second gate trench (the eighth portion p8 of FIG. 1) corresponds to the semiconductor line resistance Rp.

As shown in FIG. 10 to FIG. 12, the number of the operation portions AP provided between two connection portions CP is modifiable. The semiconductor line resistance Rp increases as the number increases.

Figure 13:
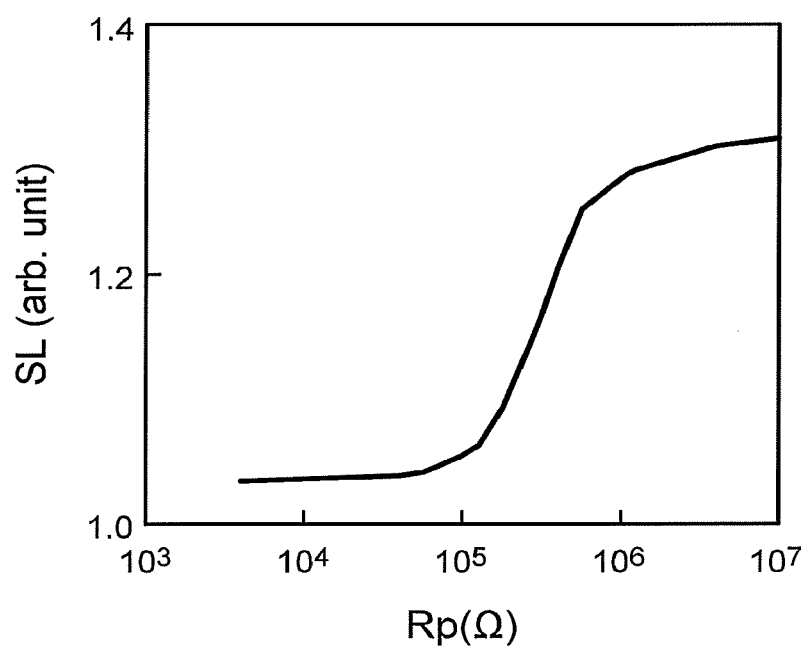
FIG. 13 is a graph illustrating a characteristic of the semiconductor device according to the first embodiment.

FIG. 13 is a graph illustrating a characteristic of the semiconductor device according to the first embodiment.

The horizontal axis of FIG. 13 is the path resistance (the semiconductor line resistance Rp ($\Omega$)). The vertical axis is a switching loss SL (arbitrary units). As shown in FIG. 13, the switching loss SL increases abruptly when the semiconductor line resistance Rp exceeds $3\times10^5\Omega$. It is favorable for the semiconductor line resistance Rp to be, for example, 300 k$\Omega$ or less. Thereby, a low switching loss SL is obtained.

For example, one of the multiple connection portions CP is most proximal to another one of the multiple connection portions CP. It is favorable for the distance between the one of the multiple connection portions CP and the other one of the multiple connection portions CP to be 40 μm or less. Thereby, a low switching loss is obtained.

The relationship between the path resistance (the semiconductor line resistance Rp) and the characteristic on-resistance will now be described.

Figure 14:
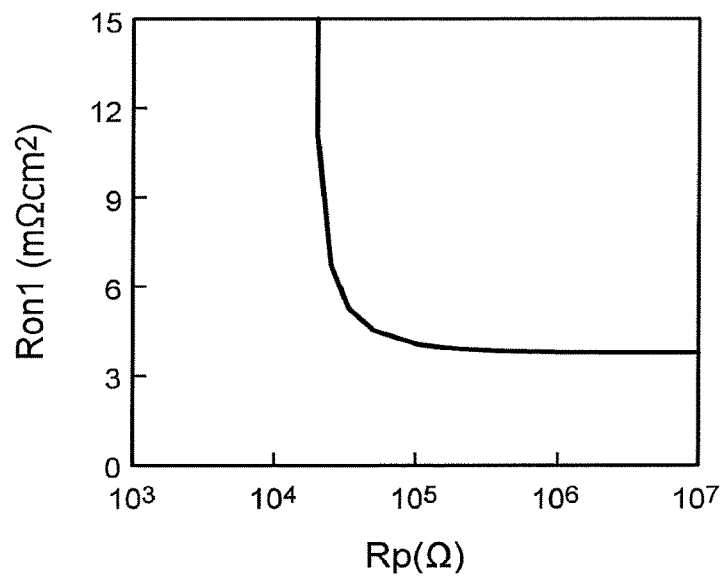
FIG. 14 is a graph illustrating a characteristic of the semiconductor device according to the first embodiment.

FIG. 14 is a graph illustrating a characteristic of the semiconductor device according to the first embodiment.

The horizontal axis of FIG. 14 is the path resistance (the semiconductor line resistance Rp ($\Omega$). The vertical axis is a characteristic on-resistance Ron1 (m$\Omega$c$^2$). As shown in FIG. 14, the characteristic on-resistance Ron1 increases abruptly when the semiconductor line resistance Rp is less than $3\times10^4\Omega$. It is favorable for the semiconductor line resistance Rp to be, for example, not less than 30 k$\Omega$. Thereby, a low characteristic on-resistance is obtained.

For example, one of the multiple connection portions CP is most proximal to another one of the multiple connection portions CP. It is favorable for the distance between the one of the multiple connection portions CP and the other one of the multiple connection portions CP to be 4 μm or more. Thereby, a low on-resistance is obtained.

For example, by increasing the proportion of the multiple connection portions CP inside the active portion, the semiconductor line resistance Rp can be reduced; and the switching loss decreases. On the other hand, by increasing the proportion of the multiple connection portions CP inside the active portion, the channel density decreases; and the characteristic on-resistance increases.

For example, multiple structure bodies are provided in the semiconductor device. Each of the multiple structure bodies includes the first to fifth conductive regions cr1 to cr5. The multiple structure bodies include a first structure body and a second structure body. The first structure body is most proximal to the second structure body among the multiple structure bodies. It is favorable for at least one selected from the group consisting of a first electrical resistance of a first semiconductor line, a second electrical resistance of a second semiconductor line, a third electrical resistance of a third semiconductor line, and a fourth electrical resistance of a fourth semiconductor line to be not less than 30 k$\Omega$ and not more than 300 k$\Omega$, wherein the first semiconductor line is from the first portion p1 included in the first structure body to the first portion p1 included in the second structure body, the second semiconductor line is from the first portion p1 included in the first structure body to the eighth portion p8 included in the second structure body, the third semiconductor line is from the eighth portion p8 included in the first structure body to the first portion p1 included in the second structure body, and the fourth semiconductor line is from the eighth portion p8 included in the first structure body to the eighth portion p8 included in the second structure body.

For example, it is favorable for at least one selected from the group consisting of a first length of the first semiconductor line, a second length of the second semiconductor line, a third length of the third semiconductor line, and a fourth length of the fourth semiconductor line to be not less than 4 μm and not more than 40 μm, wherein the first semiconductor line is from the first portion p1 included in the first structure body to the first portion p1 included in the second structure body, the second semiconductor line is from the first portion p1 included in the first structure body to the eighth portion p8 included in the second structure body, the third semiconductor line is from the eighth portion p8 included in the first structure body to the first portion p1 included in the second structure body, and the fourth semiconductor line is from the eighth portion p8 included in the first structure body to the eighth portion p8 included in the second structure body. The length of the semiconductor line changes according to the number of the operation portions AP provided between two connection portions CP.

Figure 15:
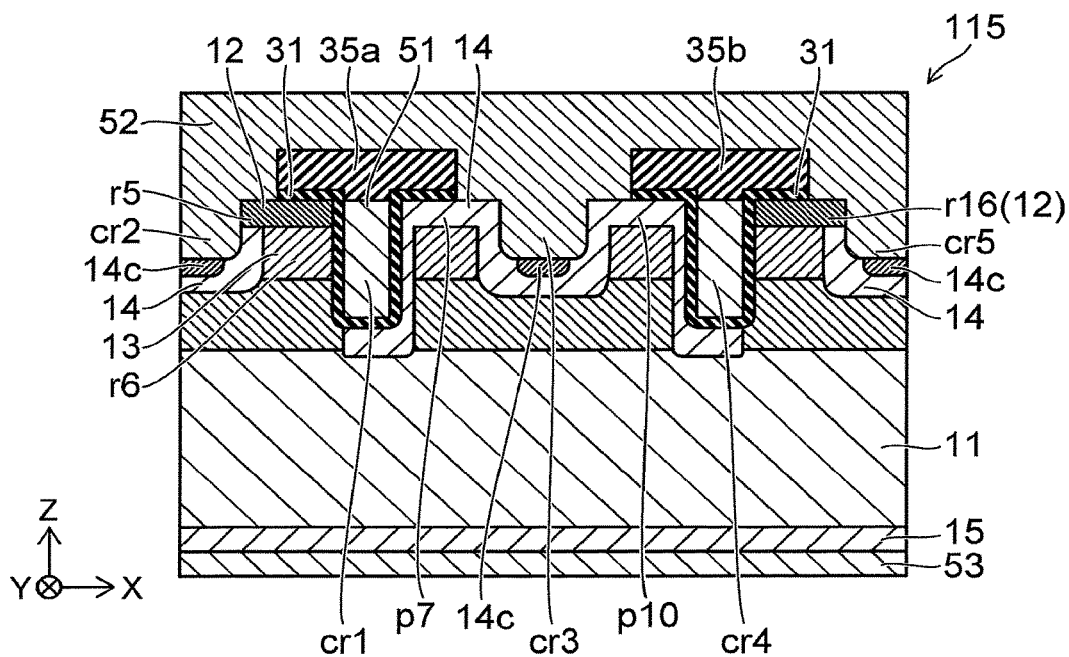
FIG. 15 is a schematic cross-sectional view illustrating another semiconductor device according to the first embodiment.

FIG. 15 is a schematic cross-sectional view illustrating another semiconductor device according to the first embodiment.

As shown in FIG. 15, the second conductive region cr2 is relatively shallow in the semiconductor device 115. Even in such a case, the fifth partial region r5 is positioned between the second conductive region cr2 and the first conductive region cr1 in the second direction (the X-axis direction). A portion of the sixth partial region r6 (a portion of the third semiconductor region 13) is positioned between the second conductive region cr2 and the first conductive region cr1 in the second direction.

Figure 16:
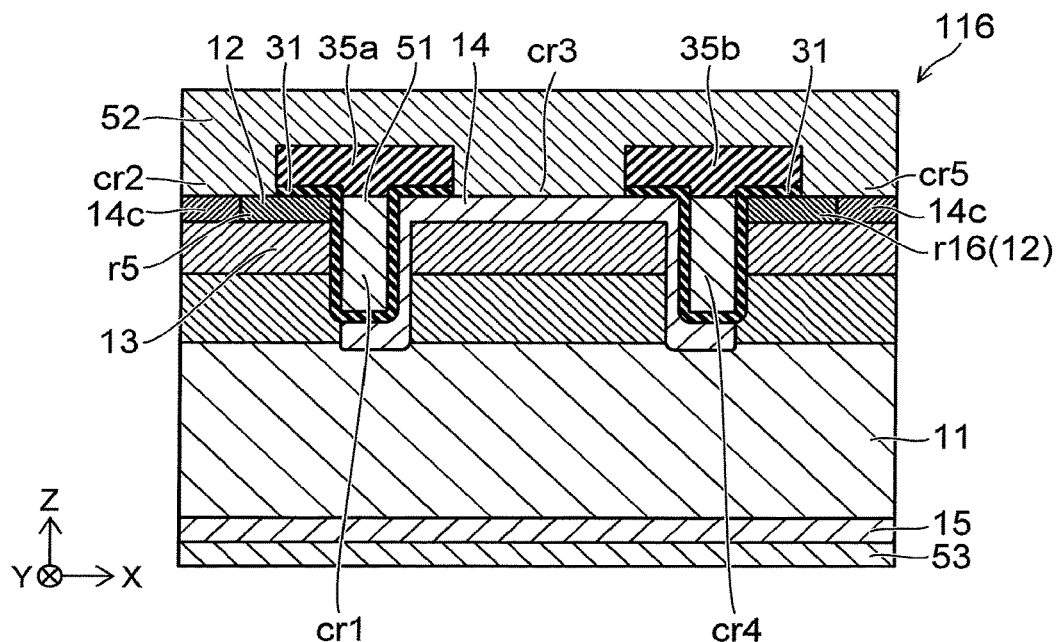
FIG. 16 is a schematic cross-sectional view illustrating another semiconductor device according to the first embodiment.

FIG. 16 is a schematic cross-sectional view illustrating another semiconductor device according to the first embodiment.

As shown in FIG. 16, the second conductive region cr2 is even shallower in the semiconductor device 116. In the embodiment, the second conductive region cr2 may not overlap the fifth partial region r5 in the second direction (the X-axis direction).

Figure 17:
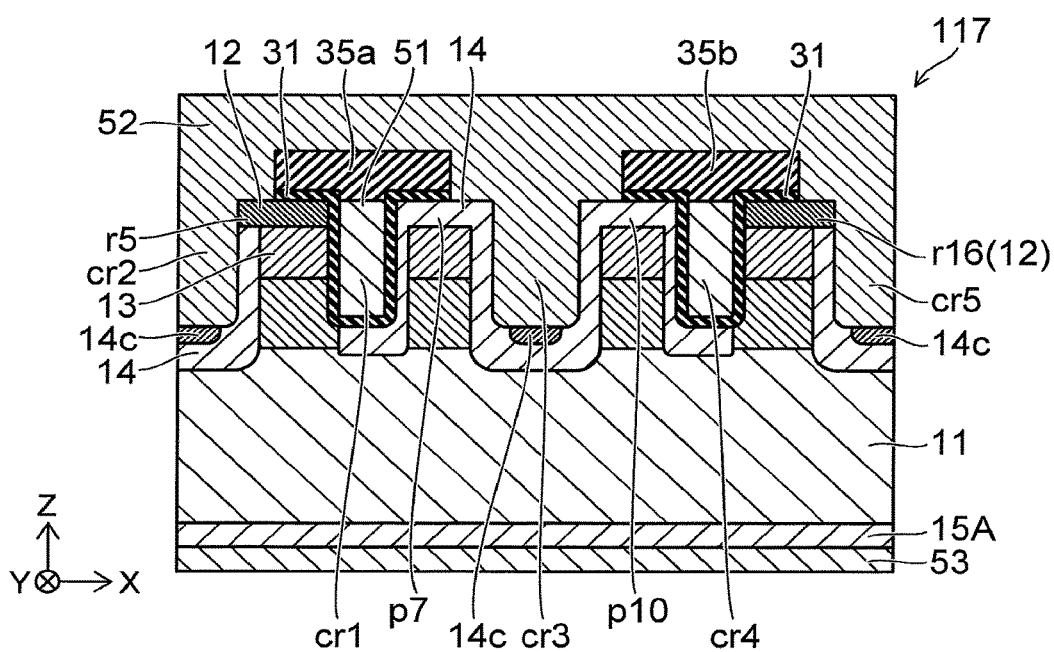
FIG. 17 is a schematic cross-sectional view illustrating another semiconductor device according to the first embodiment.

FIG. 17 is a schematic cross-sectional view illustrating another semiconductor device according to the first embodiment.

As shown in FIG. 17, a fifth semiconductor region 15A is provided in the semiconductor device 117. The fifth semiconductor region 15A is provided between the third electrode 53 and the first semiconductor region 11 and is of the second conductivity type. The semiconductor device 117 is, for example, an IGBT (Insulated Gate Bipolar Transistor). In the semiconductor device 117 as well, for example, a semiconductor device can be provided in which the switching loss can be reduced. Further, in the semiconductor device 117, for example, the characteristic on-resistance can be reduced.

According to the embodiments, a semiconductor device and a method for manufacturing the semiconductor device can be provided in which the switching loss can be reduced.

In the embodiments, the information that relates to the impurity concentration is obtained by, for example, SIMS (Secondary Ion Mass Spectrometry), etc. In the description recited above, the impurity concentration may be, for example, the carrier concentration.

In this specification, the "state of being electrically connected" includes the state in which multiple conductive bodies are physically in contact, and a current flows between the multiple conductive bodies. The "state of being electrically connected" includes the state in which another conductive body is inserted between multiple conductive bodies, and a current flows between the multiple conductive bodies.

In the specification of the application, "perpendicular" and "parallel" refer to not only strictly perpendicular and strictly parallel but also include, for example, the fluctuation due to manufacturing processes, etc. It is sufficient to be substantially perpendicular and substantially parallel.

Hereinabove, exemplary embodiments of the invention are described with reference to specific examples. However, the embodiments of the invention are not limited to these specific examples. For example, one skilled in the art may similarly practice the invention by appropriately selecting specific configurations of components included in semiconductor devices such as semiconductor regions, electrodes, conductive regions, insulating films, etc., from known art. Such practice is included in the scope of the invention to the extent that similar effects thereto are obtained.

Further, any two or more components of the specific examples may be combined within the extent of technical feasibility and are included in the scope of the invention to the extent that the purport of the invention is included.

Moreover, all semiconductor devices, and methods for manufacturing the same practicable by an appropriate design modification by one skilled in the art based on the semiconductor devices, and the methods for manufacturing the same described above as embodiments of the invention also are within the scope of the invention to the extent that the purport of the invention is included.

Various other variations and modifications can be conceived by those skilled in the art within the spirit of the invention, and it is understood that such variations and modifications are also encompassed within the scope of the invention.

While certain embodiments have been described, these embodiments have been presented by way of example only, and are not intended to limit the scope of the inventions. Indeed, the novel embodiments described herein may be embodied in a variety of other forms; furthermore, various omissions, substitutions and changes in the form of the embodiments described herein may be made without departing from the spirit of the inventions. The accompanying claims and their equivalents are intended to cover such forms or modifications as would fall within the scope and spirit of the invention.

What is claimed is:
1. A semiconductor device, comprising:
a first electrode including a first conductive region;
a second electrode including a second conductive region;
a third electrode, a first direction from a portion of the third electrode toward the first conductive region crossing a second direction from the second conductive region toward the first conductive region, a direction from another portion of the third electrode toward the second conductive region being aligned with the first direction;
a first semiconductor region of a first conductivity type, the first semiconductor region including silicon carbide and including first to fourth partial regions,
the first partial region being positioned between the first conductive region and the portion of the third electrode in the first direction,
the second partial region being positioned between the second conductive region and the another portion of the third electrode in the first direction,
the third partial region being positioned between the first partial region and the second partial region in the second direction,
a direction from the third partial region toward the fourth partial region being aligned with the first direction,
a direction from the fourth partial region toward the first conductive region being aligned with the second direction;
a second semiconductor region of the first conductivity type, the second semiconductor region including silicon carbide and including a fifth partial region, the fourth partial region being positioned between the third partial region and the fifth partial region in the first direction, a direction from the fifth partial region toward the first conductive region being aligned with the second direction;
a third semiconductor region of a second conductivity type, the third semiconductor region including silicon carbide and including a sixth partial region provided between the fourth partial region and the fifth partial region in the first direction;
a fourth semiconductor region of the second conductivity type, the fourth semiconductor region including silicon carbide, being electrically connected to the second conductive region, and including a first portion and a second portion,
the first portion being positioned between the first partial region and the first conductive region in the first direction,
a direction from the first conductive region toward the second portion being aligned with the second direction,
the second portion being continuous with the first portion; and
a first insulating film including first to third insulating regions,
the first insulating region being positioned between the first portion and the first conductive region,
the second insulating region contacting the fourth partial region and the sixth partial region and being positioned between the fourth partial region and the first conductive region, between the sixth partial region and the first conductive region, and between the fifth partial region and the first conductive region,
the third insulating region being positioned between the second portion and the first conductive region.
2. The device according to claim 1, wherein
the fourth semiconductor region further includes a third portion and a fourth portion, the third portion is positioned between the second partial region and the second conductive region in the first direction, the first conductive region is positioned between the fourth portion and the second portion in the second direction, the fourth partial region and the sixth partial region are positioned between the fourth portion and the first conductive region in the second direction, and the fourth portion is continuous with the third portion.

3. The device according to claim 2, wherein the fourth portion is positioned between the fifth partial region and the first semiconductor region in the first direction.

4. The device according to claim 1, wherein an impurity concentration of the second conductivity type in the fourth semiconductor region is higher than an impurity concentration of the second conductivity type in the sixth partial region.

5. The device according to claim 1, wherein the first electrode is positioned around the second conductive region in a plane crossing the first direction.

6. The device according to claim 1, wherein the first electrode surrounds the second conductive region in a plane crossing the first direction.

7. The device according to claim 1, wherein
the first electrode includes first to sixth sides in a plane crossing the first direction,
the second side extends in an extension direction of the first side,
the fourth side extends in an extension direction of the third side,
the sixth side extends in an extension direction of the fifth side,
the third side is connected to the first side and the sixth side,
the fifth side is connected to the first side and the fourth side,
the second side is connected to the fourth side and the sixth side,
the second conductive region is positioned between the first side and the second side,
the second conductive region is positioned between the third side and the fourth side, and
the second conductive region is positioned between the fifth side and the sixth side.

8. The device according to claim 1, wherein
the first electrode includes first to fourth sides in a plane crossing the first direction,
the second side extends in an extension direction of the first side,
the fourth side extends in an extension direction of the third side,
the third side is connected to the first side and the second side,
the fourth side is connected to the first side and the second side,
the second conductive region is positioned between the first side and the second side, and
the second conductive region is positioned between the third side and the fourth side.

9. The device according to claim 1, wherein the fifth partial region is positioned between the second conductive region and the first conductive region in the second direction.

10. The device according to claim 1, wherein the sixth partial region is positioned between the second conductive region and the first conductive region in the second direction.

11. The device according to claim 1, wherein the fourth partial region is positioned between the second conductive region and the first conductive region in the second direction.

12. The device according to claim 1, wherein
the second electrode further includes a third conductive region,
the first semiconductor region further includes seventh to ninth partial regions,
the third semiconductor region further includes a tenth partial region,
the fourth semiconductor region further includes fifth to seventh portions,
the first partial region is positioned between the third partial region and the seventh partial region in the second direction,
the eighth partial region is positioned between the first partial region and the seventh partial region in the second direction,
the ninth partial region is positioned between the eighth partial region and the tenth partial region in the first direction,
a direction from the seventh partial region toward the third conductive region is aligned with the first direction,
the fifth portion is positioned between the seventh partial region and the third conductive region in the first direction,
at least a portion of the tenth partial region is positioned between the second portion and the third conductive region in the second direction,
the sixth portion is positioned between the third conductive region and the at least a portion of the tenth partial region in the second direction, and
the tenth portion is positioned between the ninth partial region and the seventh portion in the first direction.

13. The device according to claim 12, wherein
the first electrode further includes a fourth conductive region,
the first semiconductor region further includes eleventh to fifteenth partial regions,
the second semiconductor region includes a sixteenth partial region,
the third semiconductor region further includes seventeenth and eighteenth partial regions,
the fourth semiconductor region further includes eighth to eleventh portions,
the first insulating film further includes fourth to sixth insulating regions,
the seventh partial region is positioned between the eighth partial region and the thirteenth partial region in the second direction,
the eleventh partial region is positioned between the seventh partial region and the thirteenth partial region in the second direction,
the twelfth partial region is positioned between the seventh partial region and the eleventh partial region in the second direction,
a direction from the eleventh partial region toward the fourth conductive region is aligned with the first direction, the seventeenth partial region is positioned between the third conductive region and the fourth conductive region in the second direction,
the fourteenth partial region is positioned between the twelfth partial region and the seventeenth partial region in the first direction,
a direction from the thirteenth partial region toward the sixteenth partial region is aligned with the first direction,
the fifteenth partial region is positioned between the thirteenth partial region and the sixteenth partial region in the first direction,
the eighteenth partial region is positioned between the fifteenth partial region and the sixteenth partial region in the first direction,
the eighth portion is positioned between the eleventh partial region and the fourth conductive region in the first direction,
the ninth portion is positioned between the fourth conductive region and at least a portion of the seventeenth partial region in the second direction,
the seventeenth partial region is positioned between the tenth portion and the fourteenth partial region in the first direction,
the third conductive region is positioned between the sixth portion and the eleventh portion in the second direction,
the eleventh portion is continuous with the fifth portion and the tenth portion,
the fourth insulating region is positioned between the eighth portion and the fourth conductive region,
the fifth insulating region is positioned between the ninth portion and the fourth conductive region,
the sixth insulating region is positioned between the fifteenth partial region and the fourth conductive region, between the sixteenth partial region and the fourth conductive region, and between the eighteenth partial region and the fourth conductive region, and
the sixth insulating region contacts the fifteenth partial region, the sixteenth partial region, and the eighteenth partial region.

14. The device according to claim 13, wherein
the second electrode further includes a fifth conductive region,
the third conductive region is positioned between the first conductive region and the fifth conductive region in the second direction, and
the fourth conductive region is positioned between the third conductive region and the fifth conductive region in the second direction.

15. The device according to claim 14, wherein
a plurality of structure bodies is provided,
each of the plurality of structure bodies includes the first to fifth conductive regions,
the plurality of structure bodies includes a first structure body and a second structure body,
the first structure body is most proximal to the second structure body among the plurality of structure bodies,
at least one selected from the group consisting of a first electrical resistance of a first semiconductor line, a second electrical resistance of a second semiconductor line, a third electrical resistance of a third semiconductor line, and a fourth electrical resistance of a fourth semiconductor line is not less than 30 kΩ and not more than 300 kΩ, the first semiconductor line being from the first portion included in the first structure body to the first portion included in the second structure body, the second semiconductor line being from the first portion included in the first structure body to the eighth portion included in the second structure body, the third semiconductor line being from the eighth portion included in the first structure body to the first portion included in the second structure body, the fourth semiconductor line being from the eighth portion included in the first structure body to the eighth portion included in the second structure body.

16. The device according to claim 14, wherein
a plurality of structure bodies is provided,
each of the plurality of structure bodies includes the first to fifth conductive regions,
the plurality of structure bodies includes a first structure body and a second structure body,
the first structure body is most proximal to the second structure body among the plurality of structure bodies, and
at least one selected from the group consisting of a first length of a first semiconductor line, a second length of a second semiconductor line, a third length of a third semiconductor line, and a fourth length of a fourth semiconductor line is not less than 4 μm and not more than 40 μm, the first semiconductor line being from the first portion included in the first structure body to the first portion included in the second structure body, the second semiconductor line being from the first portion included in the first structure body to the eighth portion included in the second structure body, the third semiconductor line being from the eighth portion included in the first structure body to the first portion included in the second structure body, the fourth semiconductor line being from the eighth portion included in the first structure body to the eighth portion included in the second structure body.

17. The device according to claim 1, further comprising a fifth semiconductor region provided between the third electrode and the first semiconductor region, the fifth semiconductor region being of the first conductivity type.

18. The device according to claim 1, wherein the second conductive region does not overlap the fifth partial region in the second direction.

* * * * *

UNITED STATES PATENT AND TRADEMARK OFFICE
CERTIFICATE OF CORRECTION

| | | |
|---|---|---|
| PATENT NO. | : 10,381,441 B2 | Page 1 of 1 |
| APPLICATION NO. | : 15/902360 | |
| DATED | : August 13, 2019 | |
| INVENTOR(S) | : Shinya Kyogoku et al. | |

It is certified that error appears in the above-identified patent and that said Letters Patent is hereby corrected as shown below:

On the Title Page

Item (72), the second Inventor's last name is incorrect. Item (72) should read:
-- Shinya Kyogoku, Tsukuba (JP);
Ryosuke Iijima, Setagaya (JP) --

Signed and Sealed this
Fifteenth Day of October, 2019

Andrei Iancu
*Director of the United States Patent and Trademark Office*